(12) United States Patent
Sharma et al.

(10) Patent No.: US 11,588,102 B2
(45) Date of Patent: Feb. 21, 2023

(54) SEMICONDUCTOR MATERIAL FOR RESISTIVE RANDOM ACCESS MEMORY

(71) Applicant: Intel Corporation, Santa Clara, CA (US)

(72) Inventors: Abhishek A. Sharma, Hillsboro, OR (US); Van H. Le, Portland, OR (US); Gilbert Dewey, Beaverton, OR (US); Rafael Rios, Austin, TX (US); Jack T. Kavalieros, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 956 days.

(21) Appl. No.: 16/322,890

(22) PCT Filed: Sep. 2, 2016

(86) PCT No.: PCT/US2016/050289
§ 371 (c)(1),
(2) Date: Feb. 1, 2019

(87) PCT Pub. No.: WO2018/044330
PCT Pub. Date: Mar. 8, 2018

(65) Prior Publication Data
US 2021/0384419 A1    Dec. 9, 2021

(51) Int. Cl.
*H01L 45/00*    (2006.01)
*H01L 27/24*    (2006.01)

(52) U.S. Cl.
CPC .......... *H01L 45/08* (2013.01); *H01L 27/2436* (2013.01); *H01L 45/1233* (2013.01);
(Continued)

(58) Field of Classification Search
CPC . H01L 45/08; H01L 27/2436; H01L 45/1233; H01L 45/1253; H01L 45/144;
(Continued)

(56) References Cited

U.S. PATENT DOCUMENTS

| | | | |
|---|---|---|---|
| 8,115,188 B2 * | 2/2012 | Gosain | G02F 1/1362 257/4 |
| 2009/0194760 A1 * | 8/2009 | Gosain | H01L 27/24 257/4 |

(Continued)

OTHER PUBLICATIONS

International Patent Office—International Search Report and Written Opinion dated May 11, 2017 from International Application No. PCT/US2016/050289, 16 pages.

*Primary Examiner* — Latanya N Crawford Eason
(74) *Attorney, Agent, or Firm* — Schwabe, Williamson & Wyatt, P.C.

(57) ABSTRACT

Embodiments include a resistive random access memory (RRAM) storage cell, having a resistive switching material layer and a semiconductor layer between two electrodes, where the semiconductor layer serves as an OEL. In addition, the RRAM storage cell may be coupled with a transistor to form a RRAM memory cell. The RRAM memory cell may include a semiconductor layer as a channel for the transistor, and also shared with the storage cell as an OEL for the storage cell. A shared electrode may serve as a source electrode of the transistor and an electrode of the storage cell. In some embodiments, a dielectric layer may be shared between the transistor and the storage cell, where the dielectric layer is a resistive switching material layer of the storage cell.

20 Claims, 8 Drawing Sheets

(52) U.S. Cl.
CPC ........ *H01L 45/1253* (2013.01); *H01L 45/144* (2013.01); *H01L 45/146* (2013.01); *H01L 45/147* (2013.01); *H01L 45/148* (2013.01); *H01L 45/16* (2013.01)

(58) Field of Classification Search
CPC ... H01L 45/146; H01L 45/147; H01L 45/148; H01L 45/04; H01I 27/2436; H01I 27/2445; H01I 27/2454
See application file for complete search history.

(56) References Cited

U.S. PATENT DOCUMENTS

| | | | |
|---|---|---|---|
| 2012/0012944 A1* | 1/2012 | Yl | H01L 27/0688 257/390 |
| 2013/0071984 A1* | 3/2013 | Wang | H01L 45/08 257/E45.003 |
| 2013/0295744 A1 | 11/2013 | Jo et al. | |
| 2013/0301341 A1 | 11/2013 | Jo | |
| 2013/0320286 A1 | 12/2013 | Lee et al. | |
| 2013/0341697 A1* | 12/2013 | Lin | H01L 27/2436 257/314 |
| 2015/0235698 A1 | 8/2015 | Tsai et al. | |
| 2015/0311257 A1* | 10/2015 | Nardi | H01L 45/08 257/4 |
| 2016/0043138 A1* | 2/2016 | Yl | H01L 45/08 438/104 |
| 2016/0043142 A1 | 2/2016 | Hong et al. | |

* cited by examiner

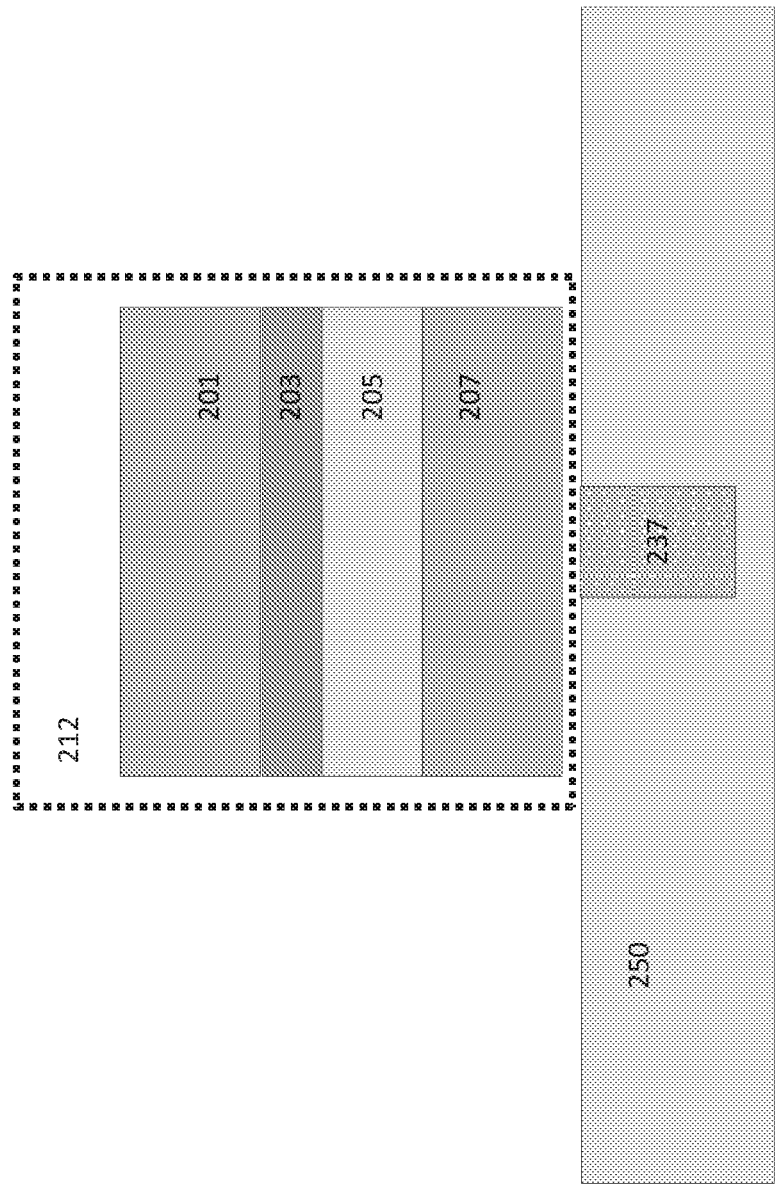

SEMICONDUCTOR MATERIAL FOR RESISTIVE RANDOM ACCESS MEMORY

CROSS REFERENCE TO RELATED APPLICATIONS

The present application is a national phase entry under 35 U.S.C. § 371 of International Application No. PCT/US2016/050289, filed Sep. 2, 2016, entitled "SEMICONDUCTOR MATERIAL FOR RESISTIVE RANDOM ACCESS MEMORY", which designated, among the various States, the United States of America. The entirety of the PCT/US2016/038823 Application is hereby incorporated by reference.

FIELD

Embodiments of the present disclosure relate generally to the technical field of electronic circuits, and more particularly to resistive random access memory (RRAM).

BACKGROUND

Resistive random access memory (RRAM) is an emerging technology for next generation non-volatile (NV) random-access memory (RAM). A RRAM memory cell may have a 1T1R configuration, which may include a RRAM storage cell coupled to a selector, such as a Si transistor. However, when a Si transistor is used as the selector, a RRAM memory cell may be area inefficient. Moreover, with devices scaling down, the Si transistor used as the selector may leak static power.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 2 schematically illustrates a RRAM storage cell to store a bit in a RRAM memory cell, in accordance with various embodiments.

DETAILED DESCRIPTION

Figure 1:
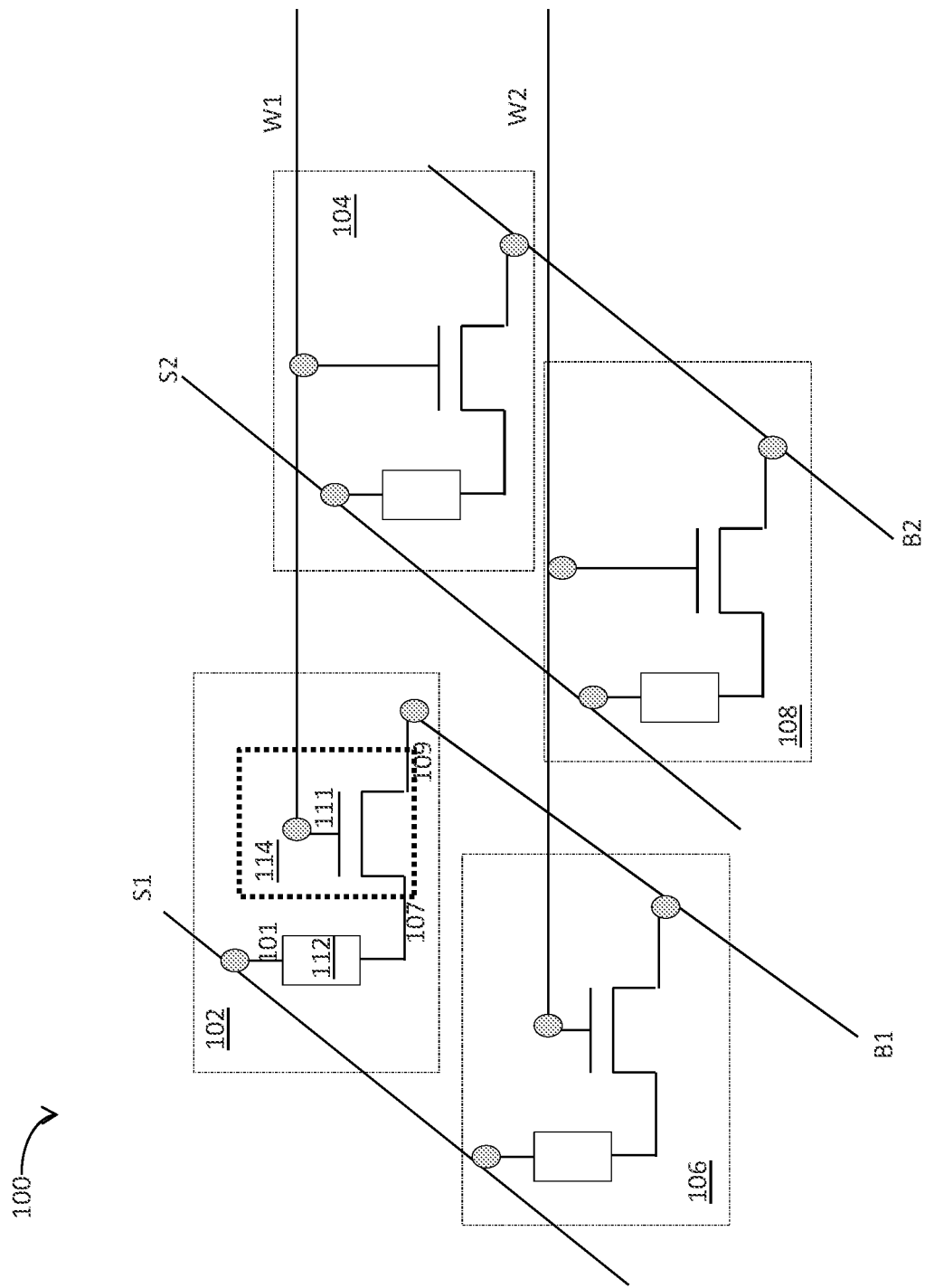
FIG. 1 schematically illustrates a resistive random access memory (RRAM) array with multiple RRAM memory cells, in accordance with various embodiments.

Resistive random access memory (RRAM) is an emerging technology for next generation non-volatile (NV) random-access memory (RAM). A RRAM array may include multiple RRAM memory cells. A RRAM memory cell may include a 1T1R configuration. Under the 1T1R configuration, a RRAM memory cell may include a RRAM storage cell coupled to a selector, e.g., a Si transistor. A RRAM memory cell may also be called a RRAM device, while a RRAM storage cell may be called a storage cell. A RRAM storage cell may store a bit of data based on the resistance value of a resistive switching material layer, rather than electronic charge.

However, when Si transistors are used as the selector, RRAM memory cells may be area inefficient. Moreover, with devices scaling down, the Si transistor used as the selector may leak static power. In embodiments, a thin film transistor with a semiconductor layer as a channel may be used as a selector for a RRAM memory cell. A thin film transistor used as a selector may provide current compliance used for switching operation of a RRAM memory cell. Furthermore, the thin film transistor used as a selector may be a back-end device integrated in a vertical stack, without occupying as much area as a Si transistor does.

In addition, from a device perspective, a RRAM storage cell may include a nucleation layer, also known as an oxygen exchange layer (OEL), for switching at low powers. Without the OEL, a RRAM storage cell may operate at high voltages and currents. An OEL may often be implemented using metals or other switching oxides, which may reduce the endurance of the RRAM device. In detail, a metal OEL may not regulate oxygen exchange as readily because of the existence of abundant oxygen within the metal. Similarly, a switching oxide based OEL may drift over time due to irreversible change in its own oxygen content. In embodiments, a semiconductor layer may be used as an OEL for a RRAM storage cell. The semiconductor layer may have metal-oxygen bonds, making the OEL robust to drift. In addition, the semiconductor layer based OEL may have a higher activation energy for oxygen exchange compared to a metal OEL, hence guarding the RRAM storage cell against hastened endurance failure that other OELs induce. Therefore a semiconductor layer based OEL may reduce the power consumption of a RRAM storage cell, without undesired impact on the endurance properties of RRAM devices.

Furthermore, in embodiments, a semiconductor layer used in a thin film transistor as a channel for a selector in a RRAM memory cell may be shared with a semiconductor layer used as an OEL in a RRAM storage cell coupled to the selector, further reducing the area and the complexity of fabrication of RRAM memory cells.

In various embodiments, a RRAM storage cell may include two electrodes. An electrode may be referred to as a terminal, or a contact. The RRAM storage cell may further include a resistive switching material layer, and a semiconductor layer as an OEL between the two electrodes. In more detail, a RRAM storage cell may include a first electrode, a semiconductor layer on the first electrode as an OEL, a resistive switching material layer on the semiconductor layer, and a second electrode on the resistive switching material layer. In addition, the RRAM storage cell may be a back-end device formed on a substrate, whereas other devices may be formed within the substrate as the front-end devices.

In various embodiments, a RRAM array may include a plurality of RRAM memory cells. A RRAM memory cell of the RRAM array may include a transistor as a selector and a RRAM storage cell coupled to the transistor. In more details, a word line of the RRAM array may be coupled to a gate electrode of the transistor. The transistor may further include a dielectric layer under the gate electrode, and a semiconductor layer under the dielectric layer, where the semiconductor layer may be a channel of the transistor. The semiconductor layer may be further shared as an OEL of the RRAM storage cell. A drain electrode of the transistor may be above or below the semiconductor layer, and coupled to a bit line of the RRAM array. Moreover, a source line of the RRAM array may be coupled to an electrode of the RRAM storage cell. In addition, the RRAM storage cell may have a shared electrode with the source electrode of the transistor. Furthermore, the RRAM storage cell may share the transistor dielectric layer under the gate electrode, to be a resistive switching material layer of the RRAM storage cell.

In various embodiments, in more detail, a RRAM memory cell may include a gate electrode of a transistor, and an electrode of a storage cell, separated from the gate electrode by a gap. A dielectric layer may be under the gate electrode and the electrode of the storage cell. The dielectric layer may be shared between the transistor and the storage cell, so that the dielectric layer may be a resistive switching material layer of the storage cell. A semiconductor layer may be under the dielectric layer, where the semiconductor layer may be a channel of the transistor and an OEL of the storage cell. Furthermore, a drain electrode of the transistor may be above or below the semiconductor layer. In addition, a shared electrode may be above or below the semiconductor layer, where the shared electrode may be a source electrode of the transistor, and another electrode of the storage cell.

In various embodiments, in more detail, a RRAM memory cell may include a gate electrode of a transistor, and a first dielectric layer under the gate electrode. A semiconductor layer may be under the first dielectric layer, where the semiconductor layer may be a channel of the transistor and an OEL of a storage cell. A drain electrode of the transistor may be above or below the semiconductor layer. In addition, a second dielectric layer may be above or below the semiconductor layer, where the second dielectric layer may be a resistive switching material layer of the storage cell. Moreover, a shared electrode may be above or below the second dielectric layer, where the shared electrode may be a source electrode of the transistor, and an electrode of the storage cell.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

FIG. 1 schematically illustrates a RRAM array 100 with multiple RRAM memory cells (e.g., RRAM memory cell 102, a RRAM memory cell 104, a RRAM memory cell 106, and a RRAM memory cell 108), in accordance with various embodiments. In embodiments, the multiple RRAM memory cells may be arranged in a number of rows and columns coupled by bit lines, e.g., bit line B1 and bit line B2, word lines, e.g., word line W1 and word line W2, and source lines, e.g., source line S1 and source line S2. The RRAM memory cell 102 may be coupled in series with the other RRAM memory cells of the same row, and may be coupled in parallel with the RRAM memory cells of the other rows. The RRAM array 100 may include any suitable number of one or more RRAM memory cells. Although the RRAM array 100 is shown in FIG. 1 with two rows that each includes two RRAM memory cells coupled in series, other embodiments may include other numbers of rows and/or numbers of RRAM memory cells within a row. In some embodiments, the number of rows may be different from the number of columns in a RRAM array. Each row of the RRAM array may have a same number of memory cells. Additionally, or alternatively, different rows may have different numbers of RRAM memory cells.

In embodiments, multiple RRAM memory cells, such as the RRAM memory cell 102, the RRAM memory cell 104, the RRAM memory cell 106, and the RRAM memory cell 108, may have a similar configuration, such as the 1T1R configuration. For example, the memory cell 102 may include a transistor 114 coupled to a RRAM storage cell 112. A RRAM memory cell with the 1T1R configuration, e.g., the RRAM memory cell 102, may be controlled through multiple electrical connections to read from the RRAM memory cells, write to the RRAM memory cells, and/or perform other memory operations.

In embodiments, the storage cell 112 may be switchable between two or more resistance values upon application of an electric current or voltage. For example, the storage cell 112 may have a first resistance value to store a logic 0 bit, and may have a second resistance value to store a logic 1 bit. In embodiments, the resistance difference between the two resistance values may be one or more orders of magnitude. The storage cell 112 may be individually controllable by the selector 114 to switch between the first and second resistance values.

A source line Si of the RRAM array 100 may be coupled to an electrode 101 of the storage cell 112, while another electrode 107 of the storage cell 112 may be shared with the transistor 114. A word line W1 of the RRAM array 100 may be coupled to a gate electrode 111 of the transistor 114. In addition, a bit line B1 of the RRAM array 100 may be coupled to another electrode, e.g., an electrode 109 of the transistor 114. The shared electrode 107 may be a source electrode or a drain electrode of the transistor 114, while the electrode 109 may be a drain electrode or a source electrode of the transistor 114. A drain electrode and a source electrode may be used interchangeably herein. Additionally, a source line and a bit line may be used interchangeably herein.

The transistor 114 may be a selector for the RRAM memory cell 102. When the word line W1 is active, the transistor 114 may select the storage cell 112. A signal may pass through the source line Si to the electrode 101 through the storage cell 112, to the shared electrode 107, further going through a channel of the transistor 114, reaching the electrode 109, followed by the bit line B1.

In various embodiments, the RRAM memory cells included in the RRAM array 100 may be formed in back-end-of-line (BEOL) processing. Accordingly, the RRAM array 100 may be formed in higher metal layers, e.g., metal layer 3 and/or metal layer 4, of the integrated circuit above the active substrate region, and may not occupy the active substrate area that is occupied by conventional transistors or memory devices.

FIG. 2 schematically illustrates a RRAM storage cell 212 to store a bit of information in a RRAM memory cell, in accordance with various embodiments. In embodiments, the RRAM storage cell 212 may be similar to the storage cell 112 of the memory cell 102 in FIG. 1.

In embodiments, the RRAM storage cell 212 may include a first electrode 207, a semiconductor layer 205 on the first electrode 207, a resistive switching material layer 203 on the semiconductor layer 205, and a second electrode 201 on the resistive switching material layer 203. The semiconductor layer 205 may be an OEL of the RRAM storage cell 212. The RRAM storage cell 212 may be a back end device formed on a substrate 250, and in contact with an electrode 237 within the substrate 250.

In embodiments, the first electrode 207 and/or the second electrode 201 may include one or more of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf. The thickness of the first electrode 207 and/or the second electrode 201 may be between a range about 100-500 nanometers (nm).

In embodiments, the resistive switching material layer 203 may include one or more of HfOx, TaOx, HfTaOx, Te, Ge, Si, or chalcogenide. Additionally or alternatively, in some embodiments, the resistive switching material layer 203 may include one or more oxide of W, Ta, Ti, Ni, Co, Hf, Ru, Zr, Zn, Fe, Sn, Al, Cu, Ag, Mo, or Cr. In some embodiments, silicon may be included in the resistive switching material layer 203 to form a composite material. The thickness of the resistive switching material layer 203 may be between a range about 20-100 nm.

In embodiments, the material in the resistive switching material layer 203 may be formed in an initial state with a first resistance value, e.g., a relatively low-resistance state. When a first voltage, e.g., a set operating voltage, is applied, the resistive switching material layer 203 may switch to a stable second resistance value, e.g., a high-resistance state, which is maintained even after the voltage is removed. This resistance switching may be reversible such that subsequent application of an appropriate current or a second voltage can serve to return the resistive switching material layer 203 to a stable first resistance value which is maintained even after the voltage or current is removed. In some embodiments, the first resistance value may be a high-resistance value rather than a low-resistance value. A set process may refer to switching the resistive switching material layer 203 from a first resistance value to a second resistance value, while a reset process may refer to switching the resistive switching material layer 203 from the second resistance value to the first resistance value. In some embodiments, the set process may be referred to as a "forming" process, while the reset process may be referred to as a "re-forming" process.

In embodiments, the semiconductor layer 205 may include ZnO, InOx, GaOx, IGZO, IZO, ITO, SnOx, Cu2O, CuO, CoO, amorphous Si, amorphous Ge, polysilicon, or some other semiconducting oxide material. The thickness of the semiconductor layer 205 may be between a range about 20-100 nm. The semiconductor layer may have metal-oxygen bonds that make the OEL of the RRAM storage cell robust to oxygen ion drift.

When a first voltage, e.g., set operating voltage, is applied to the storage cell 212 through the first electrode 207 and the second electrode 201, oxygen ions may move from the resistive switching material layer 203 to the semiconductor layer 205, which is the OEL of the storage cell 212. As oxygen ions are moved to the semiconductor layer 205, an oxygen ion concentration may be formed at the interface between the semiconductor layer 205 and the first electrode 207. As the oxygen ion concentration increases, a Schottky barrier may be formed between the semiconductor layer 205 and the first electrode 207, increasing the resistance value of the semiconductor layer 205. Accordingly, when resistance of the semiconductor layer 205 becomes higher, the resistance value of the storage cell 212 also becomes higher resistance. Therefore, the resistance of the storage cell 212 goes through a set process to switch from a first resistance value to a second resistance value. Hence, it may be considered that a first bit of data, e.g., "1" or "0", is written to the storage cell 212.

Meanwhile, if a second voltage opposite to the first voltage is applied to the storage cell 212, oxygen ions may move from the semiconductor layer 205 to the resistive switching material layer 203. Therefore, oxygen ion concentration at the interface between the semiconductor layer 205 and the first electrode 207 decreases to the concentration prior to the application of the first voltage. As a result, the Schottky barrier between the semiconductor layer 205 and the first electrode 207 is lowered. Due to the application of the second voltage, resistance of the storage cell 212 becomes lower, which may be the first resistance value. When the resistance of the storage cell 212 is the first resistance value, it may be considered that a second bit of data, e.g., "0" or "1", is written to the storage cell 212.

The storage cell 212 may be coupled to a selector that determines whether a first voltage or a second voltage may be applied to the storage cell 212. In embodiments, a selector may be a transistor including a semiconductor layer as a channel. In some embodiments, the semiconductor layer may be shared between the storage cell 212 and the selector. For example, a RRAM memory cell, e.g., the RRAM memory cell 102 shown in FIG. 1, may include a transistor 114 and the storage cell 212. Some example embodiments of integrating the storage cell 212 with a transistor may be shown below.

Figure 3A:
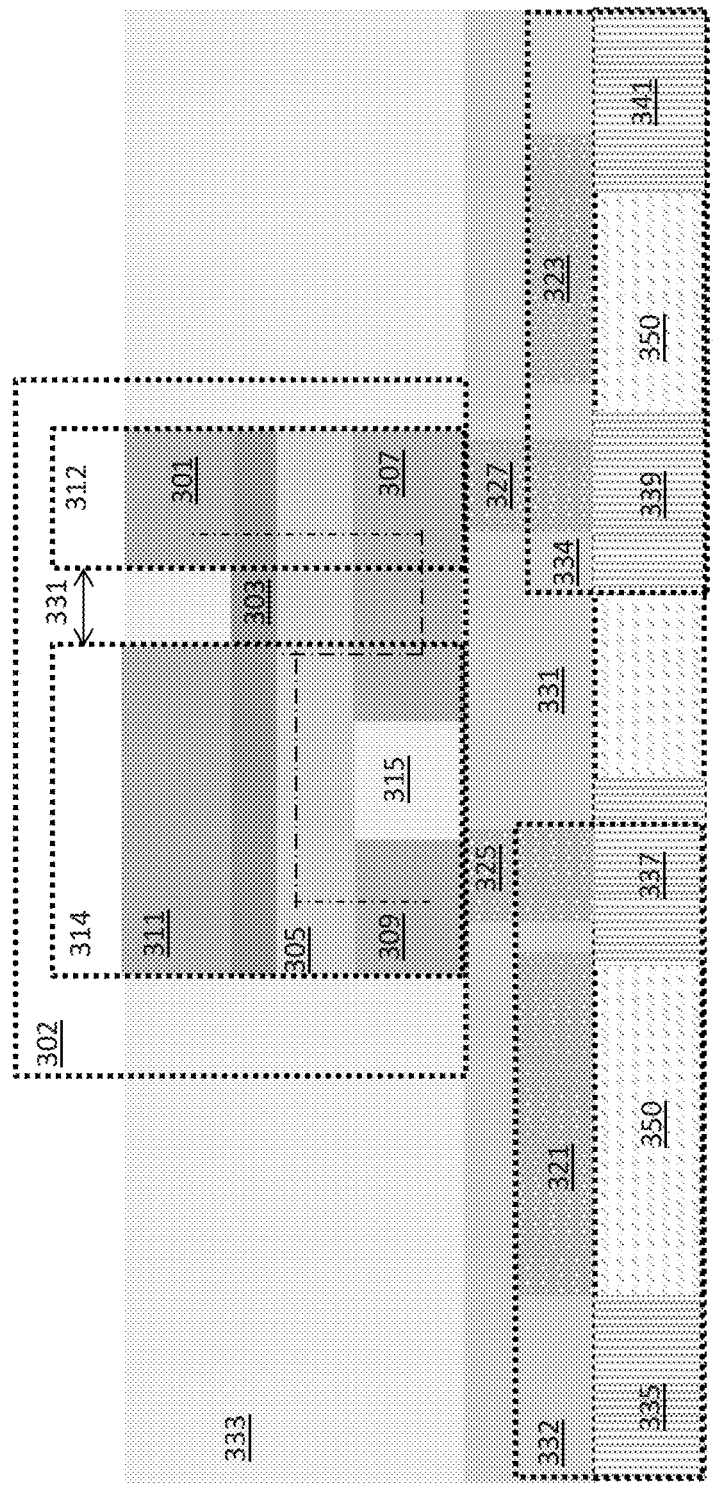
FIGS. 3A and 3B schematically illustrate a RRAM memory cell including a RRAM storage cell coupled to a transistor as a selector, in accordance with various embodiments.
Figure 3B:
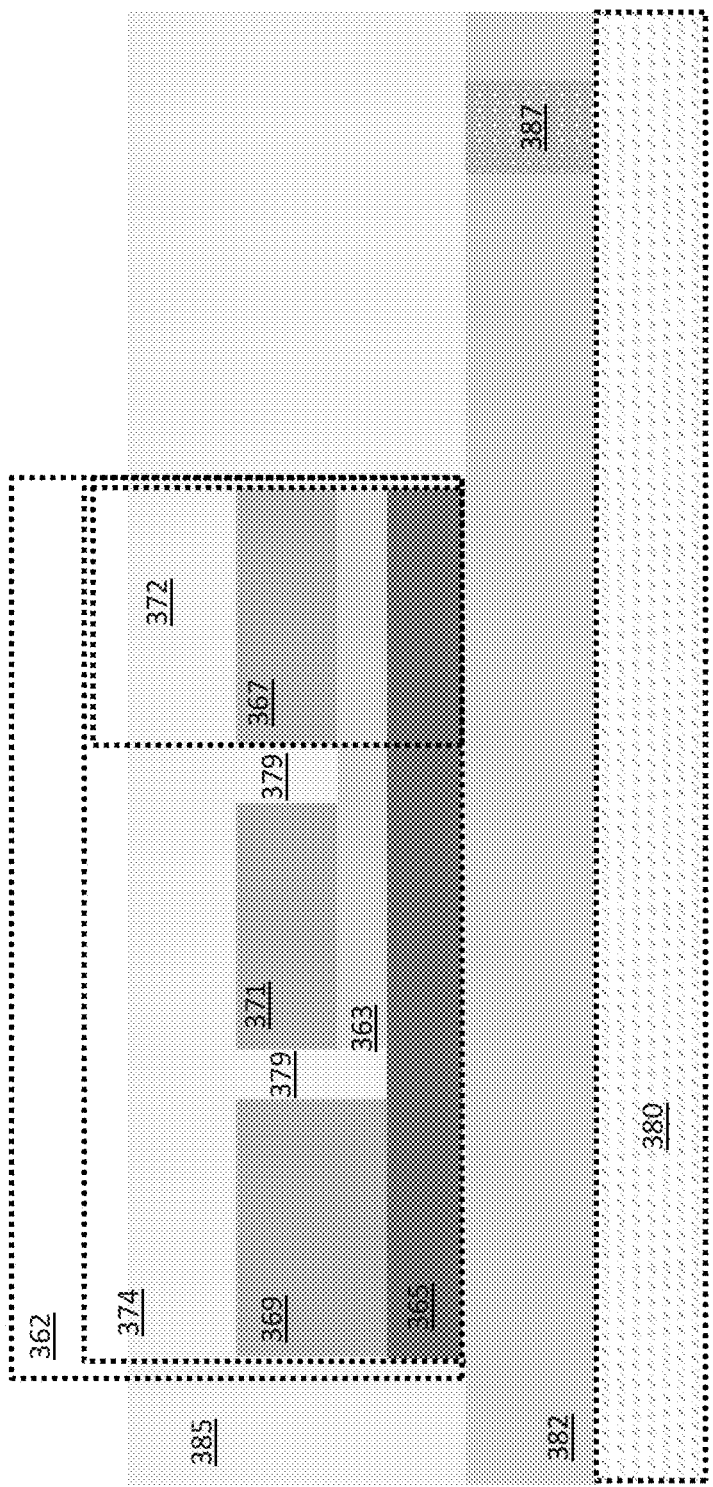

FIGS. 3A and 3B schematically illustrate a RRAM memory cell, e.g., a RRAM memory cell 302 or a RRAM memory cell 362, respectively, including a RRAM storage cell, e.g., a RRAM storage cell 312 or a RRAM storage cell 372, respectively, coupled to a transistor as a selector, e.g., a transistor 314 or a transistor 374, respectively, in accordance with various embodiments. The RRAM memory cell 302 may be similar to the memory cell 102 of FIG. 1, while the storage cell 312 may be similar to the RRAM storage cell 212 in FIG. 2. Furthermore, the RRAM memory cell 362 may be similar to the memory cell 102 of FIG. 1, while the storage cell 372 may be similar to the RRAM storage cell 212 in FIG. 2.

In detail, the RRAM memory cell 302 shown in FIG. 3A illustrates how a dielectric layer 303 may be used as a gate dielectric for the transistor 314 as well as a resistive switching material layer for the storage cell 312. Furthermore, a semiconductor layer 305 may be shared between the transistor 314 and the storage cell 312, where the semiconductor layer 305 may be a channel for the transistor 314 and an OEL for the storage cell 312. In addition, the RRAM memory cell 362 shown in FIG. 3B illustrates an alternative embodiment for how a dielectric layer 363 may be used as a gate dielectric for the transistor 374 as well as a resistive switching material layer for the storage cell 372. Furthermore, a semiconductor layer 365 may be shared between the transistor 374 and the storage cell 372, where the semiconductor layer 365 may be a channel for the transistor 374 and an OEL for the storage cell 372.

As shown in FIG. 3A, in embodiments, the transistor 314 in the RRAM memory cell 302 may include a gate electrode 311, a dielectric layer 303, a semiconductor layer 305, an electrode, e.g., a drain electrode 309, and a source electrode 307. The storage cell 312 may include the electrode 307, and an electrode 301. The semiconductor layer 305 of the transistor 314 may be shared with the storage cell 312 and function as an OEL of the storage cell 312. Furthermore, the dielectric layer 303 of the transistor 314 may be shared with the storage cell 312 and function as the resistive switching material layer of the storage cell 312. The electrode 301 may be over the dielectric layer 303 separated from the gate electrode 311 of the transistor 314. In embodiments, the gap between the electrode 301 and the gate electrode 311 may have a width in a range of about 1-20 nm. In embodiments, the gate electrode 311 may vertically overlap with the drain electrode 309 and a part of the shared electrode 307. In addition, the transistor 314 and/or the RRAM storage cell 312 may be surrounded by insulation material 315 or passivation material 333.

In embodiments, the RRAM memory cell 302 may be formed in BEOL processing, on a substrate 350. Additional devices such as a transistor 332 and a transistor 334 may be formed within the substrate 350. The transistor 332 may include a gate 321, a source 335, and a drain 337, while the transistor 334 may include a gate 323, a source 339, and a drain 341. Additional insulation material 331 may separate the transistors 332 and 334. The RRAM memory cell 302 may be formed in higher metal layers, e.g., metal layer 3 and/or metal layer 4, of the integrated circuit above the substrate 350, and may be coupled to the devices, e.g., the transistor 332 and/or the transistor 334 by electrode 325 and/or electrode 327.

In embodiments, the transistor 314 may function as a selector. A word line of the RRAM array, e.g., the W1 of FIG. 1, may be coupled to the gate electrode 311 of the transistor 314 to select the memory cell 312. Once selected, a current may flow through the channel, which is the semiconductor layer 305, of the transistor. The current may be from a source line, the S1 of FIG. 1, coupled to the electrode 301 of the storage cell 312, flowing through the resistive switching material layer 303, the semiconductor layer 305 functioning as an OEL for the storage cell 312, to the electrode 307 of the storage cell 312. The current may further follow from the electrode 307 which is a shared electrode with the transistor 314 as its source electrode, through the channel which is the semiconductor layer 305, and to the drain electrode 309 which is coupled to a bit line, e.g., B1 of FIG. 1.

As shown in FIG. 3B, in embodiments, the transistor 374 in the RRAM memory cell 362 may include a gate electrode 371, a dielectric layer 363, a semiconductor layer 365, an electrode, e.g., a drain electrode 369, and a source electrode 367. The storage cell 372 may include the electrode 367, which is shared with the transistor 374. The semiconductor layer 365 of the transistor 374 may be shared with the storage cell 372 and function as an OEL of the storage cell 372. Furthermore, the dielectric layer 363 of the transistor 374 may be shared with the storage cell 372 and function as the resistive switching material layer of the storage cell 372. The electrode 367 may be over the dielectric layer 363 separated from the gate electrode 371 of the transistor 314. In embodiments, the gap between the electrode 367 and the gate electrode 371 may have a width in a range of about 1-20 nm. In embodiments, the gate electrode 371 may be separated from the drain electrode 369 by a separation area 379, and also separated from the electrode 367 by a separation area 379. In addition, the transistor 374 and/or the RRAM storage cell 372 may be surrounded by insulation material or passivation material 385.

In embodiments, the RRAM memory cell 362 may be formed in BEOL processing, on a substrate 380. Additional devices such as transistors may be formed within the substrate 380, not shown for simplicity reasons. The RRAM memory cell 362 may be formed in higher metal layers. e.g., metal layer 3 and/or metal layer 4, of the integrated circuit above the substrate 380, and may be coupled to the devices within the substrate 380 by electrodes, e.g., electrode 387.

In embodiments, the transistor 374 may function as a selector. A word line of the RRAM array, e.g., the W1 of FIG. 1, may be coupled to the gate electrode 371 of the transistor 374 to select the memory cell 372. Once selected, a current may flow through the channel, which is the semiconductor layer 365, of the transistor. The current may be from a source line, the Si of FIG. 1, coupled to the electrode 367 of the storage cell 372, flowing through the resistive switching material layer 363, the semiconductor layer 365 functioning as an OEL for the storage cell 372, and also shared as a channel for the transistor 374, through the channel and to the drain electrode 369 which is coupled to a bit line, e.g., B1 of FIG. 1.

Figure 4A:
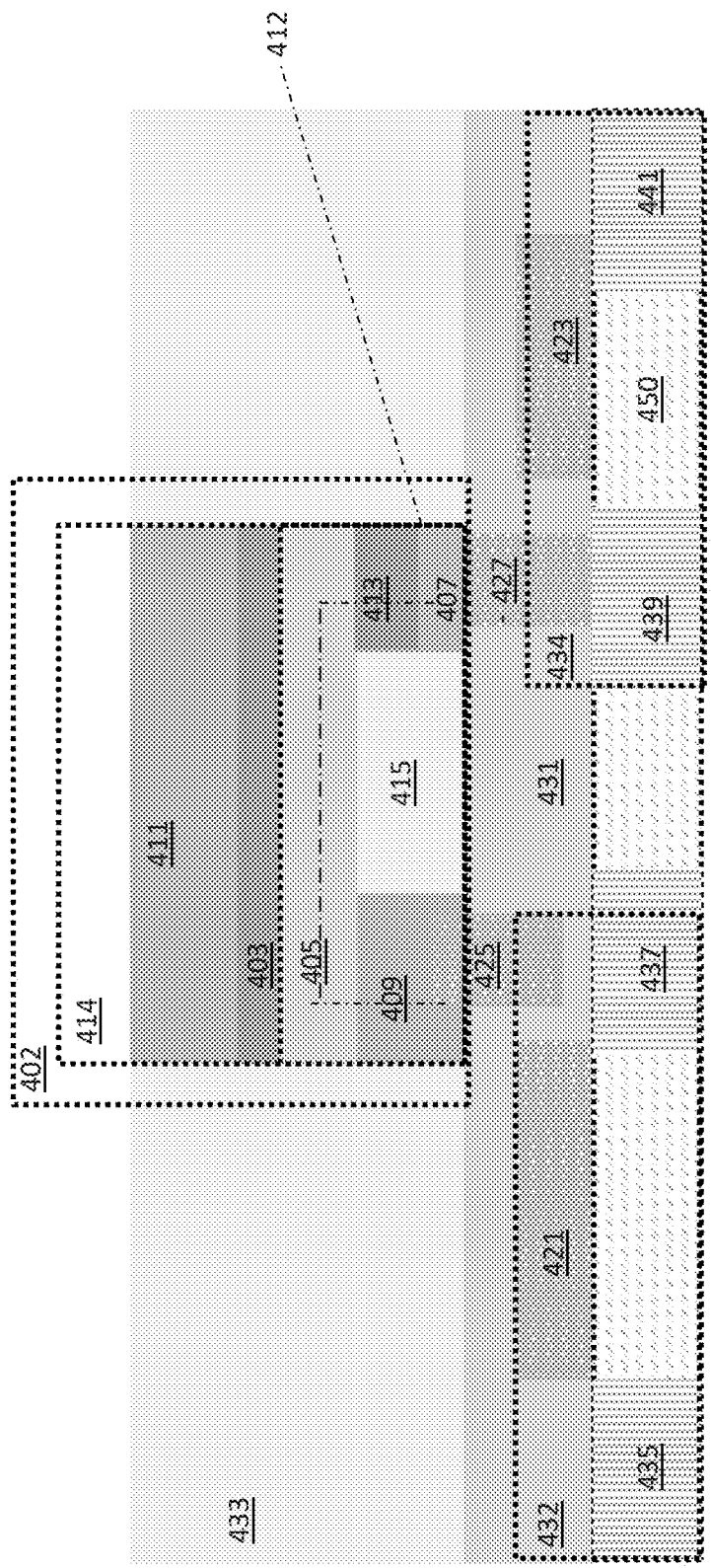
FIGS. 4A and 4B schematically illustrate another RRAM memory cell including a RRAM storage cell coupled to a transistor as a selector, in accordance with various embodiments.
Figure 4B:
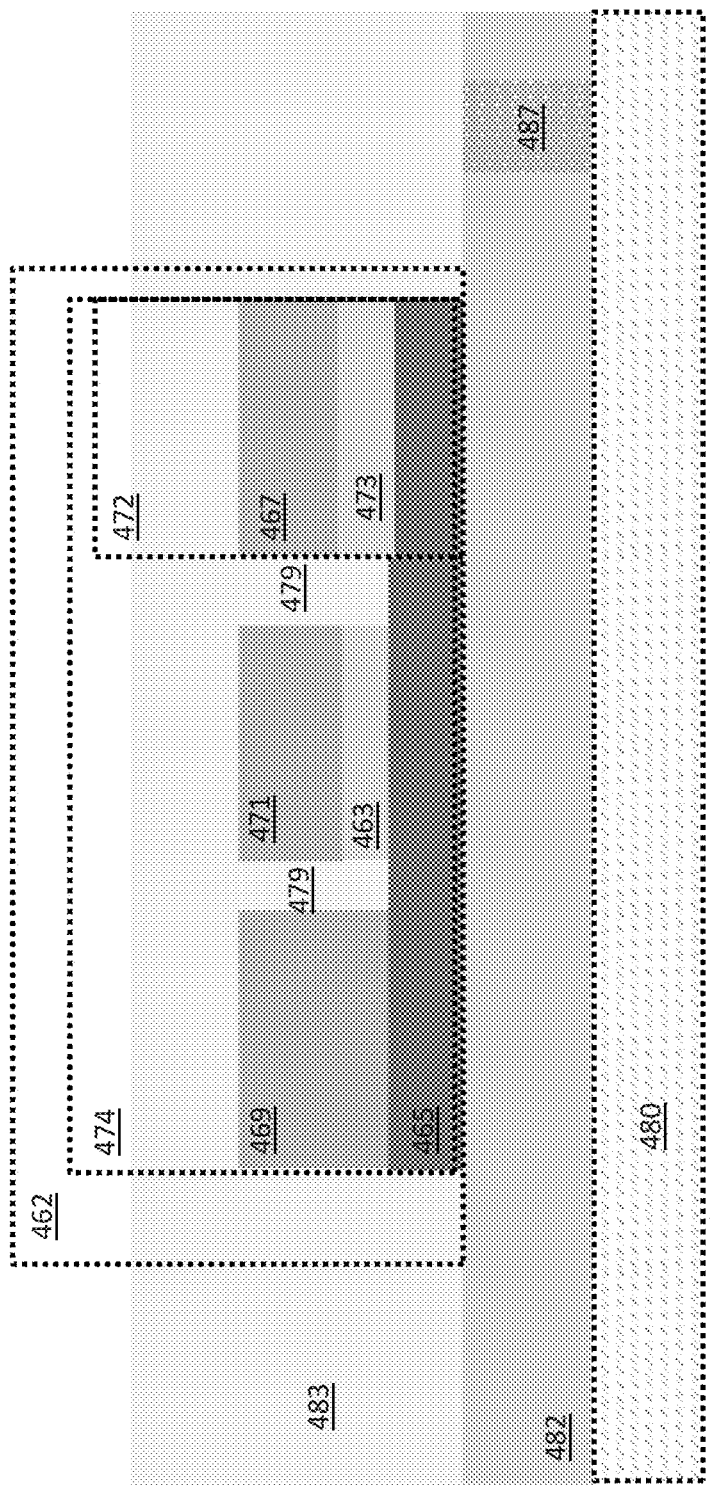

FIGS. 4A and 4B schematically illustrate another RRAM memory cell, e.g., a RRAM memory cell 402 or a RRAM memory cell 462, respectively, including a RRAM storage cell, e.g., a RRAM storage cell 412 or a RRAM storage cell 472, respectively, coupled to a transistor as a selector, e.g., a transistor 414 or a transistor 474, respectively, in accordance with various embodiments. The RRAM memory cell 402 may be similar to the memory cell 102 of FIG. 1, while the storage cell 412 may be similar to the RRAM storage cell 212 in FIG. 2. Furthermore, the RRAM memory cell 462 may be similar to the memory cell 102 of FIG. 1, while the storage cell 472 may be similar to the RRAM storage cell 212 in FIG. 2.

In embodiments, the RRAM memory cell 402 shown in FIG. 4A illustrates how a semiconductor layer 405 may be shared between the transistor 414 and the storage cell 412, where the semiconductor layer 405 may be a channel for the transistor 414 and an OEL for the storage cell 412. The RRAM memory cell 462 shown in FIG. 4B illustrates an alternative embodiment for how a semiconductor layer 465 may be shared between the transistor 474 and the storage cell 472, where the semiconductor layer 465 may be a channel for the transistor 474 and an OEL for the storage cell 472.

As shown in FIG. 4A, in embodiments, the transistor 414 of the RRAM memory cell 402 may include a gate electrode 411, a dielectric layer 403, a semiconductor layer 405, electrodes, e.g., a drain electrode 409, and a source electrode 407. The storage cell 412 may include the electrode 407 shared with the transistor 414, and another electrode shared with the drain electrode 409. The semiconductor layer 405 of the transistor 414 may be shared with the storage cell 412 and function as an OEL of the storage cell 412. The storage cell 412 may further include a resistive switching material layer 413, which may be a second dielectric layer, between the semiconductor layer 405 and the electrode 407. In embodiments, the gate electrode 411 may vertically overlap with the drain electrode 409 and the shared electrode 407. The second dielectric layer, which is the resistive switching material layer 413, may have a same width as or a similar with to a width of the shared electrode 407. In addition, the transistor 414 and/or the RRAM storage cell 412 may be surrounded by insulation material 415 or passivation material 433.

The dielectric layer 403 may be a gate dielectric layer and may include high-k dielectric material, e.g., HfO2, Ta2O5, SiO2, etc. On the other hand, the second dielectric layer, which is the resistive switching material layer 413, may include HfOx, TaOx, HfTaOx, Te, Ge, Si, or chalcogenide.

In embodiments, the RRAM memory cell 402 may be formed in BEOL processing, on a substrate 450. Additional devices such as a transistor 432 and a transistor 434 may be formed within the substrate 450. The transistor 432 may include a gate 421, a source 435, and a drain 437, while the transistor 434 may include a gate 423, a source 439, and a drain 441. Additional insulation material 431 may separate the transistors 432 and 434. The RRAM memory cell 402 may be formed in higher metal layers, e.g., metal layer 3 and/or metal layer 4, of the integrated circuit above the substrate 450, and may be coupled to the devices, e.g., the transistor 432 and/or the transistor 434 by electrode 425 and/or electrode 427.

In embodiments, the transistor 414 may function as a selector. A word line of a RRAM array, e.g., the W1 of FIG. 1, may be coupled to the gate electrode 411 of the transistor 414 to select the memory cell 412. Once selected, a current may flow through the channel, which is the semiconductor layer 405, of the transistor. The current may be from a source line, the Si of FIG. 1, coupled to the electrode 407 of the storage cell 412, flowing through the resistive switching material layer 413, the semiconductor layer 405 functioning as an OEL for the storage cell 412, to the drain electrode 409 which is coupled to a bit line, e.g., B1 of FIG. 1.

As shown in FIG. 4B, in embodiments, the transistor 474 of the RRAM memory cell 462 may include a gate electrode 471, a dielectric layer 463, a semiconductor layer 465, and electrodes, e.g., a drain electrode 469, and a source electrode 467. The storage cell 472 may include the electrode 467 shared with the transistor 414, and another electrode 469. The semiconductor layer 465 of the transistor 474 may be shared with the storage cell 472 and function as an OEL of the storage cell 472. The storage cell 472 may further include a resistive switching material layer 473, which may be a second dielectric layer, between the semiconductor layer 465 and the electrode 467. In embodiments, the gate electrode 471 may be separated from the drain electrode 469 and the shared electrode 467 by a separation area 479. The second dielectric layer, which is the resistive switching material layer 473, may have a same width as or a width similar to a width of the shared electrode 467. In addition, the transistor 474 and/or the RRAM storage cell 472 may be surrounded by insulation material or passivation material 483.

The dielectric layer 463 may be a gate dielectric layer and may include high-k dielectric material, e.g., HfO2, Ta2O5, SiO2, etc. On the other hand, the second dielectric layer, which is the resistive switching material layer 473, may include HfOx, TaOx, HfTaOx, Te, Ge, Si, or chalcogenide.

In embodiments, the RRAM memory cell 462 may be formed in BEOL processing, on a substrate 480. Additional devices such as transistors may be formed within the substrate 480, not shown for simplicity reasons. The RRAM memory cell 462 may be formed in higher metal layers, e.g., metal layer 3 and/or metal layer 4, of the integrated circuit above the substrate 480, and may be coupled to the devices within the substrate 480 by electrodes, e.g., an electrode 487.

In embodiments, the transistor 474 may function as a selector. A word line of a RRAM array, e.g., the W1 of FIG. 1, may be coupled to the gate electrode 471 of the transistor 474 to select the memory cell 472. Once selected, a current may flow through the channel, which is the semiconductor layer 465, of the transistor. The current may be from a source line, the S1 of FIG. 1, coupled to the electrode 467 of the storage cell 472, flowing through the resistive switching material layer 473, the semiconductor layer 465 functioning as an OEL for the storage cell 472, to the drain electrode 469 which is coupled to a bit line, e.g., B1 of FIG. 1.

Figure 5:
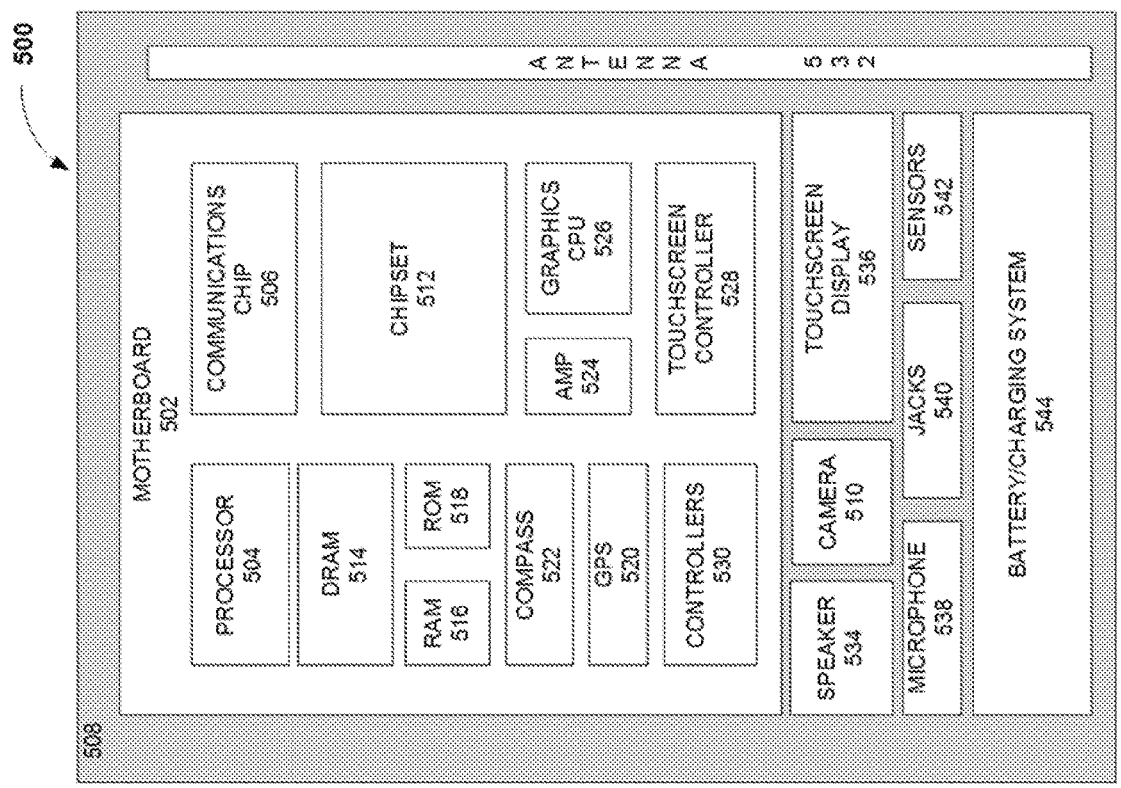
FIG. 5 illustrates an example system configured to employ the apparatuses and methods described herein, in accordance with various embodiments.

FIG. 5 illustrates an example system configured to employ the apparatuses and methods described herein, in accordance with various embodiments. FIG. 5 illustrates an example computing device 500 that may employ the apparatuses and/or methods described herein (e.g., the RRAM array 100, the RRAM storage cell 212, the RRAM memory cell 302, and the RRAM memory cell 402), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, memory controller 505, volatile memory (e.g., dynamic random access memory (DRAM) 514), non-volatile memory such as read only memory (ROM) 518, flash memory, storage device, (e.g., a hard-disk drive (HDD)), an I/O controller, a digital signal processor (not shown), a crypto processor (not shown), a graphics processor 526, one or more antenna 532, a display (not shown), a touch screen display 528, a touch screen controller 530, a battery 524, an audio codec (not shown), a video codec (not shown), a global positioning system (GPS) device 520, a compass 522, an accelerometer (not shown), a gyroscope (not shown), a speaker 534, a camera 510, and a mass storage device (such as hard disk drive, a solid state drive, compact disk (CD), digital versatile disk (DVD)) (not shown), and so forth. In various embodiments, the processor 504 may be integrated on the same die with other components to form a System on Chip (SoC).

In some embodiments, the one or more processor(s) 504, ROM 518, and/or storage device may include associated firmware (not shown) storing programming instructions configured to enable computing device 500, in response to execution of the programming instructions by one or more processor(s) 504, to practice all or selected aspects of the methods described herein. In various embodiments, these aspects may additionally or alternatively be implemented using hardware separate from the one or more processor(s) 504, flash memory 512, or storage device 511.

In various embodiments, one or more components of the computing device 500 may include one or more RRAM array that employ one or more RRAM memory cells as described herein. For example, the RRAM array with one or more RRAM memory cells may be included in processor 504, I/O controller 514, memory controller 505, and/or another component of computing device 500. Additionally, or alternatively, one or more components of the computing device 500, such as DRAM 514, RAM 516, may include the RRAM storage cell 202, the RRAM memory cell 302, and/or the RRAM memory cell 402 described herein.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

Figure 6:
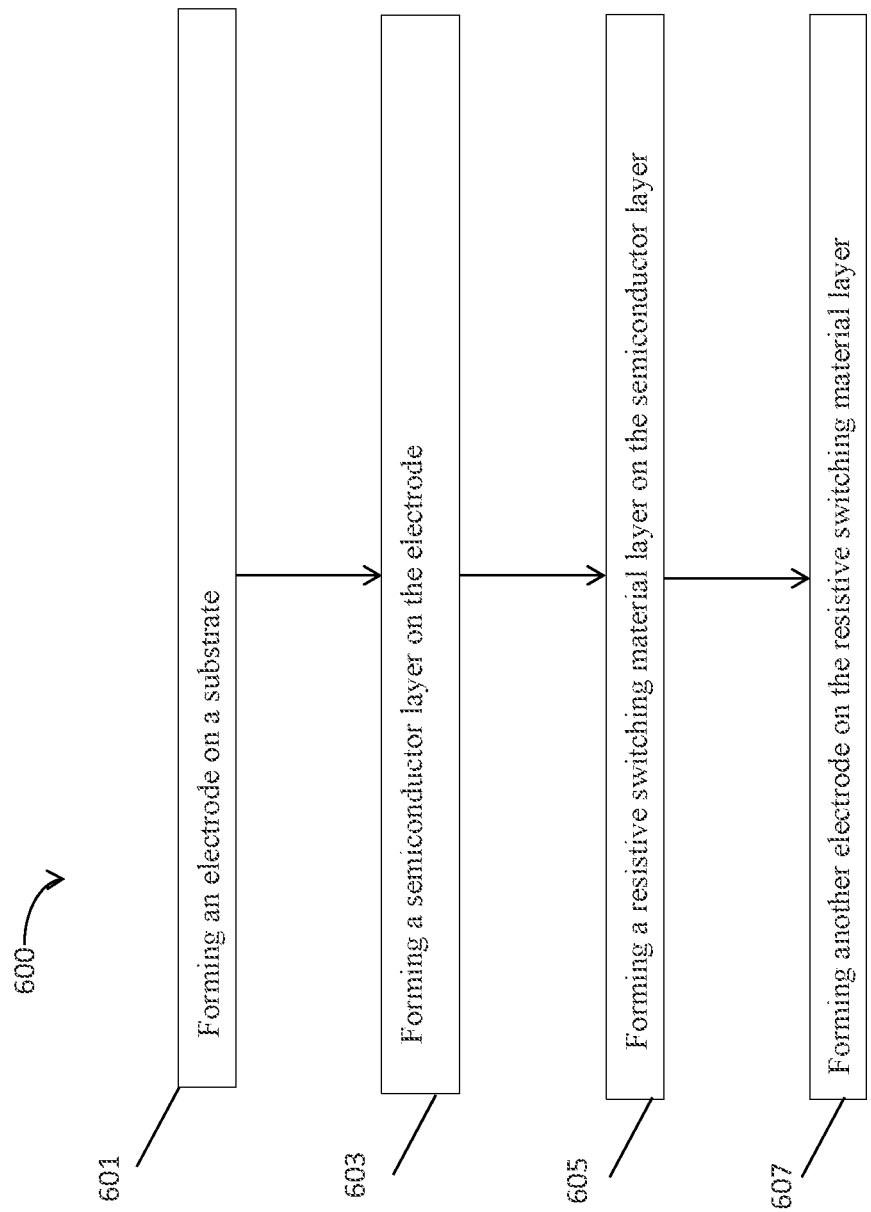
FIG. 6 illustrates an example process for manufacturing a RRAM storage cell, in accordance with various embodiments.

FIG. 6 illustrates an example process for manufacturing a RRAM storage cell, in accordance with various embodiments.

In embodiments, various processes may be used to form a RRAM array, e.g., the RRAM array 100 of FIG. 1, a RRAM storage cell, e.g., the RRAM storage cell 212 of FIG. 2, a RRAM memory cell, e.g., the RRAM memory cell 302, 362, 402, 462 of FIGS. 3A, 3B, 4A, and 4B respectively.

For example, a process 600 may be used to form a RRAM storage cell, e.g., the RRAM storage cell 212 of FIG. 2. Operation 601 may be performed to form an electrode on a substrate, such as to form the electrode 207 on the substrate 250. Operation 603 may be performed to form a semiconductor layer on the electrode, such as to form the semiconductor layer 205 on the electrode 207. Operation 605 may be performed to form a resistive switching material layer on the semiconductor layer, such as to form the resistive switching material layer 203 on the semiconductor layer 205. Operation 607 may be performed to form another electrode on the resistive switching material layer, such as to form the electrode 201 on the resistive switching material layer 203. A RRAM storage cell, e.g., the RRAM storage cell 212 may be formed by the operation 601, the operation 603, the operation 605, and the operation 607.

Some non-limiting Examples are presented below.

Example 1 may include a resistive random access memory (RRAM) storage cell, comprising: a semiconductor substrate; a first electrode on the semiconductor substrate; a semiconductor layer on the first electrode; a resistive switching material layer on the semiconductor layer; and a second electrode on the resistive switching material layer.

Example 2 may include the RRAM storage cell of example 1 and/or some other examples herein, wherein the semiconductor layer includes ZnO, InOx, GaOx, IGZO, IZO, ITO, SnOx, Cu2O, CuO, CoO, amorphous Si, amorphous Ge, or polysilicon.

Example 3 may include the RRAM storage cell of example 1 and/or some other examples herein, wherein the resistive switching material layer includes HfOx, TaOx, HfTaOx, Te, Ge, Si, or chalcogenide.

Example 4 may include the RRAM storage cell of any one of examples 1-3 and/or some other examples herein, wherein the first electrode or the second electrode includes gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf.

Example 5 may include a resistive random access memory (RRAM) device, comprising:
 a gate electrode of a transistor;
 an electrode of a storage cell, separated from the gate electrode by a gap;
 a dielectric layer under the gate electrode and the electrode of the storage cell, wherein the dielectric layer is shared between the transistor and the storage cell, and the dielectric layer is a resistive switching material layer of the storage cell;
 a semiconductor layer under the dielectric layer, wherein the semiconductor layer is a channel of the transistor and an oxygen exchange layer of the storage cell, and the semiconductor layer is on a substrate; and
 a drain electrode of the transistor above or below the semiconductor layer.

Example 6 may include the RRAM device of example 5 and/or some other examples herein, further comprising: a shared electrode above or below the semiconductor layer, wherein the shared electrode is a source electrode of the transistor, and another electrode of the storage cell.

Example 7 may include the RRAM device of example 6 and/or some other examples herein, wherein the gate electrode vertically overlaps with the drain electrode and a part of the shared electrode.

Example 8 may include the RRAM device of any one of examples 5-7 and/or some other examples herein, wherein the semiconductor layer includes ZnO, InOx, GaOx, IGZO, IZO, ITO, SnOx, Cu2O, CuO, CoO, amorphous Si, amorphous Ge, or polysilicon.

Example 9 may include the RRAM device of any one of examples 5-7 and/or some other examples herein, wherein the dielectric layer includes HfOx, TaOx, HfTaOx, Te, Ge, Si, or chalcogenide.

Example 10 may include the RRAM device of any one of examples 5-7 and/or some other examples herein, wherein the electrode of the storage cell, the gate electrode, or the drain electrode includes gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf.

Example 11 may include the RRAM device of any one of examples 5-7 and/or some other examples herein, wherein the gap has a width in a range of about 1-20 nanometers (nm).

Example 12 may include a resistive random access memory (RRAM) device, comprising:
 a gate electrode of a transistor;
 a first dielectric layer under the gate electrode;
 a semiconductor layer under the first dielectric layer, wherein the semiconductor layer is a channel of the transistor and an oxygen exchange layer of a storage cell, and the semiconductor layer is on a substrate;
 a drain electrode of the transistor above or below the semiconductor layer;
 a second dielectric layer above or below the semiconductor layer, wherein the second dielectric layer is a resistive switching material layer of the storage cell, and
 a shared electrode above or below the second dielectric layer, wherein the shared electrode is a source electrode of the transistor, and an electrode of the storage cell.

Example 13 may include the RRAM device of example 12 and/or some other examples herein, wherein the drain electrode is separated from the shared electrode by an insulation material.

Example 14 may include the RRAM device of example 12 and/or some other examples herein, wherein the second dielectric layer has a same width as a width of the shared electrode.

Example 15 may include the RRAM device of any one of examples 12-14 and/or some other examples herein, wherein the semiconductor layer includes ZnO, InOx, GaOx, IGZO, IZO, ITO, SnOx, Cu2O, CuO, CoO, amorphous Si, amorphous Ge, or polysilicon.

Example 16 may include the RRAM device of any one of examples 12-14 and/or some other examples herein, wherein the second dielectric layer includes HfOx, TaOx, HfTaOx, Te, Ge, Si, or chalcogenide.

Example 17 may include the RRAM device of any one of examples 12-14 and/or some other examples herein, wherein the gate electrode, the drain electrode, or the shared electrode includes gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf.

Example 18 may include the RRAM device of any one of examples 12-14 and/or some other examples herein, wherein a thickness of the first dielectric layer, the second dielectric layer, or the semiconductor layer is in a range of about 1-20 nm.

Example 19 may include a computing device, comprising:
 a circuit board; and
 a memory device coupled to the circuit board and including a resistive random access memory (RRAM) array, wherein the RRAM array includes a plurality of RRAM memory cells, and wherein a RRAM memory cell of the plurality of RRAM memory cells includes a transistor and a storage cell, and further includes:
  a word line of the RRAM array coupled to a gate electrode of the transistor;
  a dielectric layer under the gate electrode;
  a semiconductor layer under the dielectric layer, wherein the semiconductor layer is a channel of the transistor, and an oxygen exchange layer of the storage cell;
  a bit line of the RRAM array coupled to a drain electrode of the transistor, wherein the drain electrode is above or below the semiconductor layer; and
  a source line of the RRAM array coupled to an electrode of the storage cell.

Example 20 may include the computing device of example 19 and/or some other examples herein, wherein the storage cell further includes a resistive switching material layer between the semiconductor layer and the electrode of the storage cell.

Example 21 may include the computing device of example 19 and/or some other examples herein, wherein the electrode of the storage cell is on the dielectric layer and separated from the gate electrode by a gap, the electrode of the storage cell is a first electrode of the storage cell, the storage cell further comprises a second electrode, the semiconductor layer and the dielectric layer are between the first electrode and the second electrode of the storage cell, and the dielectric layer is a resistive switching material layer of the storage cell.

Example 22 may include the computing device of any one of examples 19-21 and/or some other examples herein, wherein the semiconductor layer includes ZnO, InOx, GaOx, IGZO, IZO, ITO, SnOx, Cu2O, CuO, CoO, amorphous Si, amorphous Ge, or polysilicon.

Example 23 may include the computing device of any one of examples 19-21 and/or some other examples herein, wherein the dielectric layer includes HfOx, TaOx, HfTaOx, Te, Ge, Si, or chalcogenide.

Example 24 may include the computing device of any one of examples 19-21 and/or some other examples herein, wherein the gate electrode, the drain electrode, or the electrode of the storage cell includes gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf.

Example 25 may include the computing device of any one of examples 19-21 and/or some other examples herein, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Although certain embodiments have been illustrated and described herein for purpose of description, this application is intended to cover any adaptations or variations of the embodiments discussed herein. Therefore, it is manifestly intended that embodiments described herein be limited only by the claims.

What is claimed is:

1. A resistive random access memory (RRAM) device, comprising: a gate electrode of a transistor; an electrode of a storage cell, separated from the gate electrode by a gap; a dielectric layer under the gate electrode and the electrode of the storage cell, wherein the dielectric layer is shared between the transistor and the storage cell, and the dielectric layer is a resistive switching material layer of the storage cell; a semiconductor layer under the dielectric layer, wherein the semiconductor layer is a channel of the transistor and an oxygen exchange layer of the storage cell, and the semiconductor layer is on a substrate; a drain electrode of the transistor above or below the semiconductor layer; wherein the gate electrode vertically overlaps with the drain electrode and a part of a shared electrode.

2. The RRAM device of claim 1, wherein the shared electrode is a source electrode of the transistor and another electrode of the storage cell.

3. The RRAM device of claim 1, wherein the semiconductor layer includes ZnO, InOx, GaOx, IGZO, IZO, ITO, SnOx, Cu2O, CuO, CoO, amorphous Si, amorphous Ge, or polysilicon.

4. The RRAM device of claim 1, wherein the dielectric layer includes HfOx, TaOx, HfTaOx, Te, Ge, Si, or chalcogenide.

5. The RRAM device of claim 1, wherein the electrode of the storage cell, the gate electrode, or the drain electrode includes gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), TaN, TiN, TiAlN, TiW, or Hf.

6. The RRAM device of claim 1, wherein the gap has a width in a range of about 1-20 nanometers (nm).

7. A resistive random access memory (RRAM) device, comprising:
   a gate electrode of a transistor;
   a first dielectric layer under the gate electrode;
   a semiconductor layer under the first dielectric layer, wherein the semiconductor layer is a channel of the transistor and an oxygen exchange layer of a storage cell, and the semiconductor layer is on a substrate;
   a drain electrode of the transistor above or below the semiconductor layer;
   a second dielectric layer above or below the semiconductor layer, wherein the second dielectric layer is a resistive switching material layer of the storage cell; and
   a shared electrode above or below the second dielectric layer, wherein the shared electrode is a source electrode of the transistor and an electrode of the storage cell, and wherein the gate electrode vertically overlaps with the drain electrode and a part of the shared electrode.

8. The RRAM device of claim 7, wherein the drain electrode is separated from the shared electrode by an insulation material.

9. The RRAM device of claim 7, wherein the second dielectric layer has a same width as a width of the shared electrode.

10. The RRAM device of claim 7, wherein the semiconductor layer includes ZnO, InOx, GaOx, IGZO, IZO, ITO, SnOx, Cu2O, CuO, CoO, amorphous Si, amorphous Ge, or polysilicon.

11. The RRAM device of claim 7, wherein the second dielectric layer includes HfOx, TaOx, HfTaOx, Te, Ge, Si, or chalcogenide.

12. The RRAM device of claim 7, wherein the gate electrode, the drain electrode, or the shared electrode includes gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), TaN, TiN, TiAlN, TiW, or Hf.

13. The RRAM device of claim 7, wherein a thickness of the first dielectric layer, the second dielectric layer, or the semiconductor layer is in a range of about 1-20 nm.

14. A computing device, comprising:
   a circuit board; and
   a memory device coupled to the circuit board and including a resistive random access memory (RRAM) array, wherein the RRAM array includes a plurality of RRAM memory cells, and wherein a RRAM memory cell of the plurality of RRAM memory cells includes a transistor and a storage cell, and further includes:
      a word line of the RRAM array coupled to a gate electrode of the transistor;
      a dielectric layer under the gate electrode;
      a semiconductor layer under the dielectric layer, wherein the semiconductor layer is a channel of the transistor, and an oxygen exchange layer of the storage cell;
      a bit line of the RRAM array coupled to a drain electrode of the transistor, wherein the drain electrode is above or below the semiconductor layer;
      a source line of the RRAM array coupled to an electrode of the storage cell; and
   wherein the electrode of the storage cell is on the dielectric layer and separated from the gate electrode by a gap, the electrode of the storage cell is a first electrode of the storage cell, the storage cell further comprises a second electrode, and the semiconductor layer and the dielectric layer are between the first electrode and the second electrode of the storage cell.

15. The computing device of claim 14, wherein the storage cell further includes a resistive switching material layer between the semiconductor layer and the electrode of the storage cell.

16. The computing device of claim 14, wherein the dielectric layer is a resistive switching material layer of the storage cell.

17. The computing device of claim 14, wherein the semiconductor layer includes ZnO, InOx, GaOx, IGZO, IZO, ITO, SnOx, Cu2O, CuO, CoO, amorphous Si, amorphous Ge, or polysilicon.

18. The computing device of claim 14, wherein the dielectric layer includes HfOx, TaOx, HfTaOx, Te, Ge, Si, or chalcogenide.

19. The computing device of claim 14, wherein the gate electrode, the drain electrode, or the electrode of the storage cell includes gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), TaN, TiN, TiAlN, TiW, or Hf.

20. The computing device of claim 14, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *